US008223565B2

(12) United States Patent
Ueda

(10) Patent No.: US 8,223,565 B2
(45) Date of Patent: Jul. 17, 2012

(54) RESISTANCE CHANGE MEMORY WITH CURRENT CONTROL AND VOLTAGE CONTROL DURING A WRITE OPERATION, AND WRITE METHOD OF THE SAME

(75) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 828 days.

(21) Appl. No.: 12/183,537

(22) Filed: Jul. 31, 2008

(65) Prior Publication Data

US 2009/0034320 A1 Feb. 5, 2009

(30) Foreign Application Priority Data

Aug. 2, 2007 (JP) ................................ 2007-202320

(51) Int. Cl.
*G11C 7/22* (2006.01)
(52) U.S. Cl. .............. 365/189.16; 365/230.06; 365/148; 365/163; 365/158; 365/173
(58) Field of Classification Search .................. 365/148, 365/163, 158, 173, 171, 189.16, 230.06, 365/230.07
See application file for complete search history.

(56) References Cited

U.S. PATENT DOCUMENTS

| | | | |
|---|---|---|---|
| 4,535,329 A * | 8/1985 | Koyanagi et al. | 345/105 |
| 5,695,864 A | 12/1997 | Slonczewski | |
| 6,038,172 A * | 3/2000 | Rai et al. | 365/185.2 |
| 6,750,469 B2 * | 6/2004 | Ichihara et al. | 257/2 |
| 7,139,192 B1 * | 11/2006 | Wong | 365/185.03 |
| 7,420,851 B2 * | 9/2008 | Fasoli | 365/185.25 |
| 7,443,710 B2 * | 10/2008 | Fang et al. | 365/148 |
| 2008/0123393 A1 * | 5/2008 | Kinoshita | 365/148 |

FOREIGN PATENT DOCUMENTS

| | | |
|---|---|---|
| JP | 2003-100085 | 4/2003 |
| JP | 2006-324501 | 11/2006 |
| WO | WO 2006/036622 | 4/2006 |
| WO | WO 2006/137111 | 12/2006 |
| WO | WO 2007/074504 | 7/2007 |

OTHER PUBLICATIONS

Woo Yeong Cho, et al., "A 0.18-μm 3.0- V 64- Mb Nonvolatile Phase-Transition Random Access Memory (PRAM)", IEEE Journal of Solid-State Circuits, vol. 40, No. 1, Jan. 2005, pp. 293-300.
Nikkei Microdevices, Nov. 2006, pp. 97-99.
Office Action issued Jan. 17, 2012 in Japanese Application No. 2007-202320 filed Aug. 2, 2007 (w/English translation).

* cited by examiner

*Primary Examiner* — Andrew Q Tran
(74) *Attorney, Agent, or Firm* — Oblon, Spivak, McClelland, Maier & Neustadt, L.L.P.

(57) ABSTRACT

A resistance change memory includes a resistance change element having a high-resistance state and a low-resistance state in accordance with write information, and a write circuit configured to supply a write current that the write current flowing through the resistance change element is held constant before and after the resistance change element is changed from the high-resistance state to the low-resistance state, and apply a write voltage that the write voltage applied to the resistance change element is held constant before and after the resistance change element is changed from the low-resistance state to the high-resistance state.

13 Claims, 14 Drawing Sheets

| Heat amount (P) per unit time | Decrease resistance (0 write) | Increase resistance (1 write) |
|---|---|---|
| Current control ($P=RI^2$) | Reduce ◯ | Increase ✕ |
| Voltage control ($P=V^2/R$) | Increase ✕ | Reduce ◯ |

Decrease resistance: performed by current control = constant current supply ≒ current limitation Increase resistance: performed by voltage control = constant voltage application ≒ voltage limitation

Suppress write error or resistance value change error caused by heat by reducing heat amount P of element after resistance is changed

F I G. 3

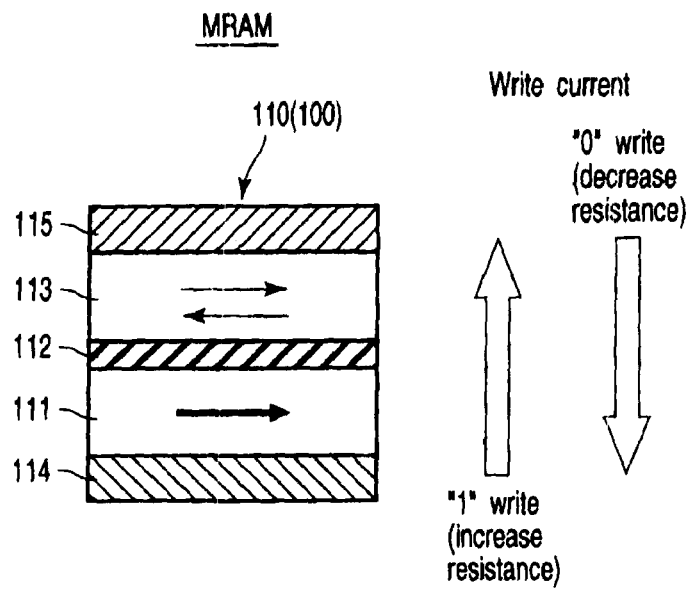

F I G. 4

MRAM

ReRAM (unipolar type)
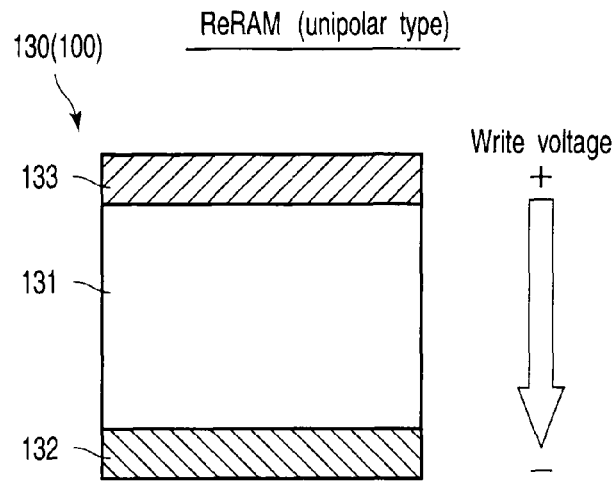
FIG. 9
ReRAM (unipolar type)
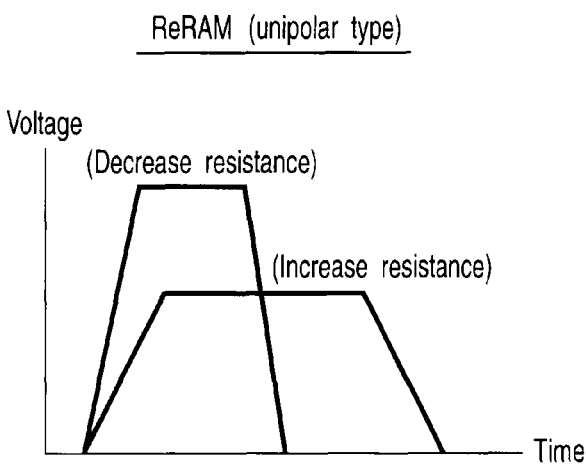
FIG. 10
Resistance change memory
| MRAM | ReRAM | | PRAM |
|---|---|---|---|
| | Bipolar type | Unipolar type | |
| Bidirectional write | | Unidirectional write | |
FIG. 11

RESISTANCE CHANGE MEMORY WITH CURRENT CONTROL AND VOLTAGE CONTROL DURING A WRITE OPERATION, AND WRITE METHOD OF THE SAME

CROSS-REFERENCE TO RELATED APPLICATIONS

This application is based upon and claims the benefit of priority from prior Japanese Patent Application No. 2007-202320, filed Aug. 2, 2007, the entire contents of which are incorporated herein by reference.

BACKGROUND OF THE INVENTION

1. Field of the Invention

The present invention relates to a resistance change memory having a resistance change element, and a write method of the resistance change memory.

2. Description of the Related Art

An MRAM (Magnetoresistive Random Access Memory) using a magnetoresistive element, a PRAM (Phase-change Random Access Memory) using a chalcogenide element, an ReRAM (Resistance Random Access Memory) using a transition metal oxide element, and the like are known as resistance change memories using resistance change elements. The feature of these resistance change memories is that information is stored by using the change in resistance value.

In a spin transfer torque magnetization switching type MRAM, magnetization in a magnetization free layer is inverted by spin transfer torque in accordance with the direction of an electric current supplied to the magnetoresistive element, thereby controlling the resistance value of the element (e.g., patent reference 1). In the PRAM, the phase is changed to a crystalline state or amorphous state by controlling the process from heating to cooling in accordance with the magnitude and the shape such as the width of a current/voltage pulse applied to the chalcogenide element, thereby controlling the resistance value of the element (e.g., patent reference 2 and non-patent reference 1). The resistance value of the transition metal oxide element of a bipolar ReRAM is controlled in accordance with the direction of a current/voltage pulse applied to the element, and that of the transition metal oxide element of a unipolar ReRAM is controlled in accordance with the magnitude and the shape such as the width of a current/voltage pulse applied to the element (e.g., non-patent reference 2). These resistance change memories thus write information in the resistance change elements.

To read out information stored in the resistance change element of any of the resistance change memories described above, a read current is supplied to the resistance change element, and the resistance value is converted into a current value or voltage value. The resistance state is determined by comparing this current value or voltage value with a reference value.

In the resistance change memories as described above, care should be taken so that the write current or voltage after the resistance has changed has no effect, e.g., causes no write error on the state of the resistance change element in data write.

[Patent reference 1] U.S. Pat. No. 5,695,864
[Patent reference 2] Jpn. Pat. Appln. KOKAI Publication No. 2006-324501
[Non-patent reference 1] Woo Yeong Cho et al., "A 0.18-μm 3.0-V 64-Mb Nonvolatile Phase-Transition Random Access Memory (PRAM)", IEEE JOURNAL OF SOLID-STATE CIRCUITS, VOL. 40, NO. 1, JANUARY 2005
[Non-patent reference 2] November 2007 NIKKEI MICRODEVICES P97-99

BRIEF SUMMARY OF THE INVENTION

A resistance change memory according to the first aspect of the present invention comprising: a resistance change element having a high-resistance state and a low-resistance state in accordance with write information; and a write circuit configured to supply a write current that the write current flowing through the resistance change element is held constant before and after the resistance change element is changed from the high-resistance state to the low-resistance state, and apply a write voltage that the write voltage applied to the resistance change element is held constant before and after the resistance change element is changed from the low-resistance state to the high-resistance state.

A resistance change memory according to the second aspect of the present invention comprising a memory cell in which a resistance change element having a high-resistance state and a low-resistance state in accordance with write information and a cell transistor are connected in series, wherein when changing the resistance change element from the high-resistance state to the low-resistance state, a write current is supplied from the resistance change element to the cell transistor, and when changing the resistance change element from the low-resistance state to the high-resistance state, the write current is supplied from the cell transistor to the resistance change element.

A write method of a resistance change memory according to the third aspect of the present invention including a resistance change element having a high-resistance state and a low-resistance state in accordance with write information, the method comprising supplying a write current that the write current flowing through the resistance change element is held constant before and after the resistance change element is changed from the high-resistance state to the low-resistance state, and applying a write voltage that the write voltage applied to the resistance change element is held constant before and after the resistance change element is changed from the low-resistance state to the high-resistance state.

BRIEF DESCRIPTION OF THE SEVERAL VIEWS OF THE DRAWING

FIG. 3 is a view showing the heat amounts resulting from current control and voltage control when decreasing and increasing the resistance of the resistance change element according to the embodiment of the present invention;

FIG. 4 is a sectional view of a magnetoresistive effect element of an MRAM according to the embodiment of the present invention;

FIG. 9 is a sectional view of a transition metal oxide element of a unipolar ReRAM according to the embodiment of the present invention;

FIG. 10 is a graph showing the low-resistance state and high-resistance state of the transition metal oxide element of the unipolar ReRAM shown in FIG. 9;

FIG. 11 is a view showing the classification of the resistance change memories according to the embodiment of the present invention;

DETAILED DESCRIPTION OF THE INVENTION

Figure 1:
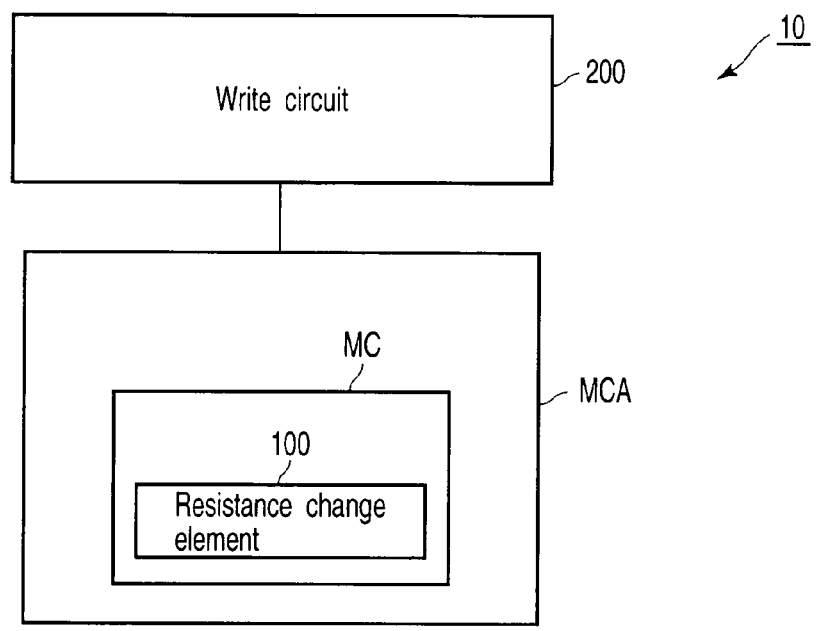
FIG. 1 is a view for explaining an outline of a resistance change memory according to an embodiment of the present invention.

Embodiments of the present invention will be explained below with reference to the accompanying drawing. In the following explanation, the same reference numerals denote the same parts throughout the drawing.

[1] Outline

Figure 2A:
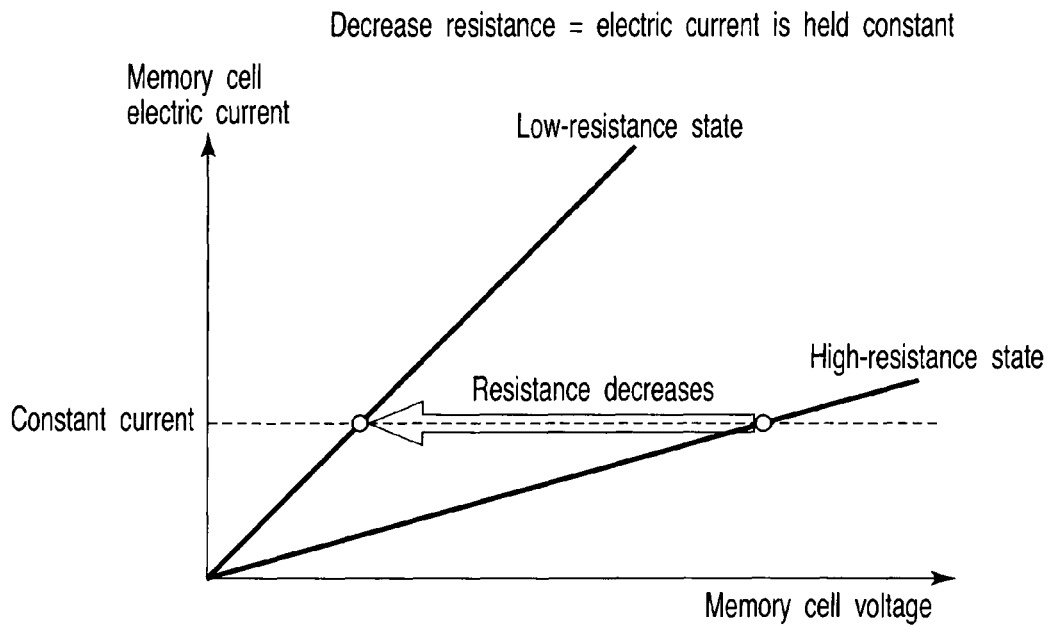
FIGS. 2A and 2B are graphs for explaining the control that the resistance of a resistance change element according to the embodiment of the present invention is decreased by holding an electric current constant and increased by holding a voltage constant.
Figure 2B:
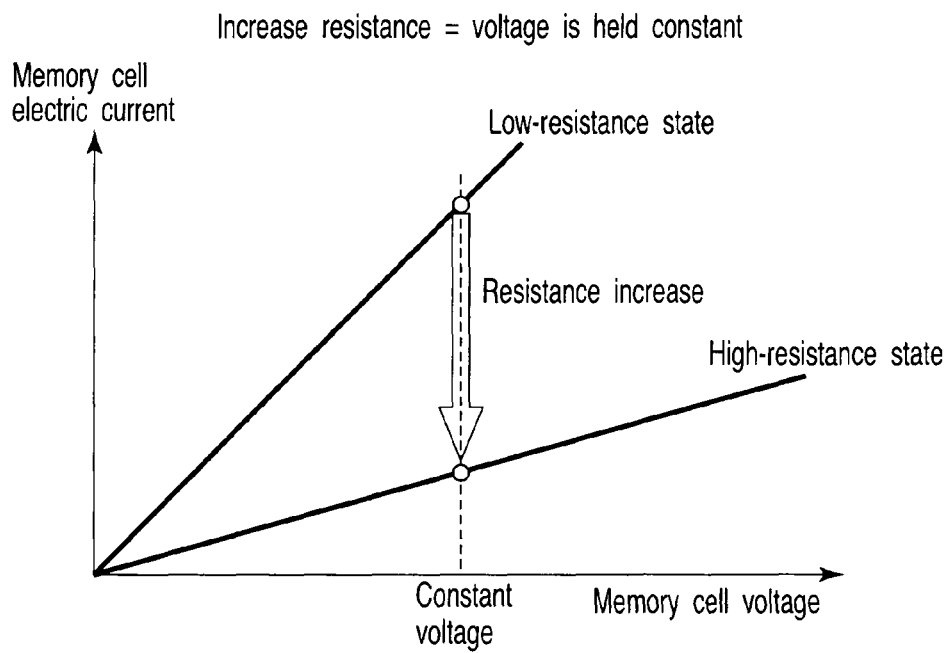

FIG. 1 is a view for explaining an outline of a resistance change memory according to an embodiment of the present invention. FIGS. 2A and 2B are graphs for explaining the control that the resistance of a resistance change element according to the embodiment of the present invention is decreased by holding an electric current constant and increased by holding a voltage constant. The outline of the resistance change memory according to this embodiment will be explained below.

As shown in FIG. 1, a resistance change memory 10 includes a memory cell array MCA and write circuit 200. The memory cell array MCA comprises a plurality of memory cells MC arranged in the form of an array. Each memory cell MC has a resistance change element 100 having a high-resistance state and low-resistance state in accordance with write information.

In the resistance change memory 10 as described above, the write circuit 200 is controlled as follows when writing information in the resistance change element 100.

First, when changing the resistance change element 100 from the high-resistance state to the low-resistance state (e.g., 0 write), a write current is supplied such that the write current flowing through the resistance change element 100 is held constant before and after this change (FIG. 2A). On the other hand, when changing the resistance change element 100 from the low-resistance state to the high-resistance state (e.g., 1 write), a write voltage is applied such that the write voltage applied to the resistance change element 100 is held constant before and after this change (FIG. 2B).

That is, in this embodiment, current control or voltage control is selected in accordance with whether write information is "0" or "1". When decreasing the resistance (0 write), information is written in the resistance change element 100 by current control. When increasing the resistance (1 write), information is written in the resistance change element 100 by voltage control.

[2] Current Control and Voltage Control

FIG. 3 is a view showing the heat amounts resulting from current control and voltage control when decreasing and increasing the resistance of the resistance change element according to the embodiment of the present invention. The reason why the above-mentioned write method is adopted will be explained below on the basis of the heat amounts per unit time resulting from current control and voltage control.

[2-1] Decrease Resistance (0 Write)

First, assume that the resistance change element 100 in the high-resistance state is rewritten into the low-resistance state. This corresponds to, e.g., 0 write.

To apply a constant write voltage to the resistance change element 100, a constant-voltage circuit, for example, is connected to the memory cell MC. In this case, letting R be the resistance of the resistance change element 100 and V be the write voltage, a heat amount P per unit time of the resistance change element 100 is represented by $$P = V^2/R \quad (1)$$

In equation (1) above, if the resistance change element 100 changes from the high-resistance state to the low-resistance state while the constant voltage is applied, the resistance R of the resistance change element 100 decreases, so the heat amount P increases after the change. This increase in heat amount P caused by the resistance change adversely affects the storage state of the resistance change element 100, e.g., increases write errors or resistance variations.

On the other hand, to supply a constant write current to the resistance change element 100, a constant-current circuit, for example, is connected to the memory cell MC. In this case, letting R be the resistance of the resistance change element 100 and I be the write current, the heat amount P per unit time of the resistance change element 100 is represented by $$P = RI^2 \quad (2)$$

In equation (2) above, if the resistance change element 100 changes from the high-resistance state to the low-resistance state while the constant current is supplied, the resistance R of the resistance change element 100 decreases, so the heat amount P reduces after the change. Accordingly, there is no adverse effect on the storage state of the resistance change element 100.

From the foregoing, when rewriting the resistance change element 100 in the high-resistance state into the low-resistance state, it is presumably favorable to supply a constant current rather than a constant voltage.

[2-2] Increase Resistance (1 Write)

Next, assume that the resistance change element 100 in the low-resistance state is rewritten into the high-resistance state. This corresponds to, e.g., 1 write.

To supply a constant write current to the resistance change element 100, a constant-current circuit, for example, is connected to the memory cell MC. In this case, the heat amount P per unit time of the resistance change element 100 is represented by equation (2).

In equation (2), if the resistance change element 100 changes from the low-resistance state to the high-resistance state while the constant current is supplied, the resistance R of the resistance change element 100 increases, so the heat amount P increases after the change. This increase in heat amount P caused by the resistance change adversely affects the storage state of the resistance change element 100, e.g., increases write errors or resistance variations.

On the other hand, to apply a constant write voltage to the resistance change element 100, a constant-voltage circuit, for example, is connected to the memory cell MC. In this case, the heat amount P per unit time of the resistance change element 100 is represented by equation (1).

In equation (1), if the resistance change element 100 changes from the low-resistance state to the high-resistance state while the constant voltage is applied, the resistance R of the resistance change element 100 increases, so the heat amount P reduces after the change. Accordingly, there is no adverse effect on the storage state of the resistance change element 100.

From the foregoing, when rewriting the resistance change element 100 in the low-resistance state into the high-resistance state, it is probably desirable to apply a constant voltage rather than a constant current.

[3] Resistance Change Memories

Examples of the resistance change memory of this embodiment are an MRAM, PRAM, and ReRAM. These resistance change memories will be explained below.

[3-1] MRAM

FIG. 4 is a sectional view of a magnetoresistive effect element of an MRAM according to the embodiment of the present invention. The magnetoresistive effect element of the MRAM will be explained below.

As shown in FIG. 4, this MRAM has a magnetoresistive effect element 110 in a memory cell. The magnetoresistive effect element 110 is a resistance change element 100, e.g., an MTJ (Magnetic Tunnel Junction) element. The magnetoresistive effect element 110 can take two steady states by the spin transfer torque magnetization switching method. More specifically, the magnetoresistive effect element 110 has at least a fixed layer 111, a free layer (recording layer) 113, and an interlayer 112 formed between the fixed layer 111 and free layer 113. It is also possible to form a lower electrode 114 on the surface of the fixed layer 111 away from the surface opposing the interlayer 112, and an upper electrode 115 on the surface of the free layer 113 away from the surface opposing the interlayer 112.

The fixed layer 111 is made of a ferromagnetic material, and has a fixed magnetization direction. For example, magnetization in the fixed layer 111 can be fixed by forming an antiferromagnetic layer (not shown) on the surface of the fixed layer 111 away from the surface opposing the interlayer 112.

The free layer 113 is made of a ferromagnetic material. No such fixing mechanism as that for the fixed layer 111 is formed for the magnetization direction in the free layer 113. Accordingly, the magnetization direction in the free layer 113 is variable.

The interface 112 is made of a nonmagnetic material. The interlayer 112 desirably has a film thickness that isolates the fixed layer 111 and free layer 113 from each other to such an extent that the direct interaction between the fixed layer 111 and free layer 113 is negligible. At the same time, the film thickness of the interlayer 112 is desirably smaller than the spin diffusion length because when a write current is supplied to the magnetoresistive effect element 110, conduction electrons transmitted through the fixed layer 111 must not reverse the spin direction before reaching the free layer 113. As the interlayer 112, it is possible to use, e.g., a nonmagnetic metal, nonmagnetic semiconductor, or insulating film.

Note that each of the fixed layer 111 and free layer 113 is not limited to a single layer as shown in FIG. 4. For example, at least one of the fixed layer 111 and free layer 113 may also have a stacked structure including a plurality of ferromagnetic layers.

In addition, at least one of the fixed layer 111 and free layer 113 may also have an antiferromagnetic coupling structure which includes three layers, i.e., a first ferromagnetic layer/ nonmagnetic layer/second ferromagnetic layer, and in which the first and second ferromagnetic layers are magnetically coupled (by interlayer exchange coupling) so that their magnetization directions are antiparallel, or a ferromagnetic coupling structure in which the first and second ferromagnetic layers are magnetically coupled (by interlayer exchange coupling) so that their magnetization directions are parallel.

A double-junction structure may also be used. A magnetoresistive effect element having the double-junction structure includes a first fixed layer, a second fixed layer, a free layer, a first interlayer formed between the first fixed layer and free layer, and a second interlayer formed between the second fixed layer and free layer. Compared to a single-junction structure, the double-junction structure has the advantage that it is possible to further increase the ratio of a resistance value in the low-resistance state to that in the high-resistance state, i.e., a so-called MR ratio (Magneto-Resistance ratio).

As the ferromagnetic material of the fixed layer 111 and free layer 113, it is possible to use, e.g., Co, Fe, Ni, or an alloy containing any of these metals.

When using a nonmagnetic metal as the interlayer 112, it is possible to use any of Au, Cu, Cr, Zn, Ga, Nb, Mo, Ru, Pd, Ag, Hf, Ta, W, Pt, and Bi, or an alloy containing at least one of these metals. Note that when allowing the interlayer 112 to function as a tunnel barrier layer, it is possible to use an insulating oxide such as $Al_2O_3$, $SiO_2$, MgO, or AlN.

As the material of the antiferromagnetic layer, it is possible to use, e.g., Fe—Mn, Pt—Mn, Pt—Cr—Mn, Ni—Mn, Pd—Mn, NiO, $Fe_2O_3$, or a magnetic semiconductor.

The magnetization directions in the fixed layer 111 and free layer 113 of the magnetoresistive effect element 110 can be perpendicular to the film surfaces (a perpendicular magnetization type element), and parallel to the film surfaces (an in-plane magnetization type element or parallel magnetization type element). Note that the perpendicular magnetization type element is suitable for micropatterning because the element shape need not be controlled in order to determine the magnetization direction unlike in the in-plane magnetization type element.

Figure 5A:
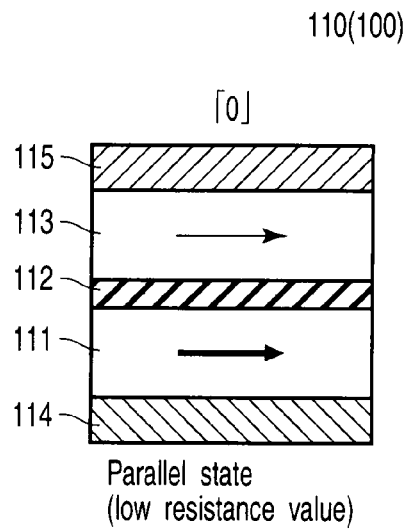
FIGS. 5A and 5B are sectional views respectively showing the low-resistance state and high-resistance state of the magnetoresistive effect element shown in FIG. 4.
Figure 5B:
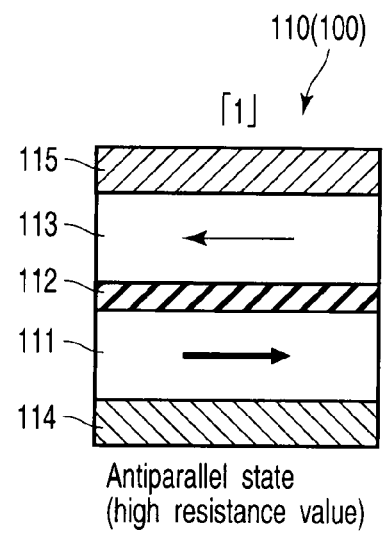

FIGS. 5A and 5B are views respectively showing the low-resistance state and high-resistance state of the magnetoresistive effect element shown in FIG. 4. The low-resistance state and high-resistance state of the magnetoresistive effect element obtained by spin transfer torque write will be explained below.

First, assume that the magnetization direction in the free layer 113 which is antiparallel to that in the fixed layer 111 is reversed, thereby making the former parallel to the latter (decreasing the resistance).

In this case, an electron flow is supplied from the fixed layer 111 to the free layer 113. That is, a write current is supplied from the free layer 113 to the fixed layer 111. Generally, many electrons in an electron flow passing through a certain magnetic material have spins parallel to the magnetization direction in this magnetic material. Therefore, many electrons in the electron flow passing through the fixed layer 111 have spins parallel to the magnetization direction in the fixed layer 111. This electron flow mainly contributes to the torque acting on magnetization in the free layer 113. Note that the rest of electrons in the electron flow has spins antiparallel to the magnetization direction in the fixed layer 111.

Next, assume that magnetization in the free layer 113 which is parallel to the magnetization direction in the fixed layer 111 is reversed, thereby making the former antiparallel to the latter (increasing the resistance).

In this case, an electron flow is supplied from the free layer 113 to the fixed layer 111. This electron flow is transmitted through the free layer 113, and many electrons having spins antiparallel to the magnetization direction in the fixed layer 111 are reflected by the fixed layer 111 and return to the free layer 113. These electrons having spins antiparallel to the magnetization direction in the fixed layer 111 flow into the free layer 113 again, and mainly contribute to the torque acting on magnetization in the free layer 113. Note that some electrons transmitted through the free layer 113 and having spins antiparallel to the magnetization direction in the fixed layer 111 are transmitted through the fixed layer 111, although the number of these electrons is small.

In the spin transfer torque write described above, the resistance state of the magnetoresistive effect element 110 is made to correspond to the logic to be stored. That is, the case where the magnetization directions in the fixed layer 111 and free layer 113 are in the parallel state (low-resistance state) is regarded as "0" as shown in FIG. 5A, and the case where the magnetization directions in the fixed layer 111 and free layer 113 are in the antiparallel state (high-resistance state) is regarded as "1" as shown in FIG. 5B.

Note that in a write operation, current control is performed to set the magnetization directions in the fixed layer 111 and free layer 113 in the parallel state (low-resistance state), and voltage control is performed to set the magnetization directions in the fixed layer 111 and free layer 113 in the antiparallel state (high-resistance state). Details will be described later.

[3-2] PRAM

Figure 6:
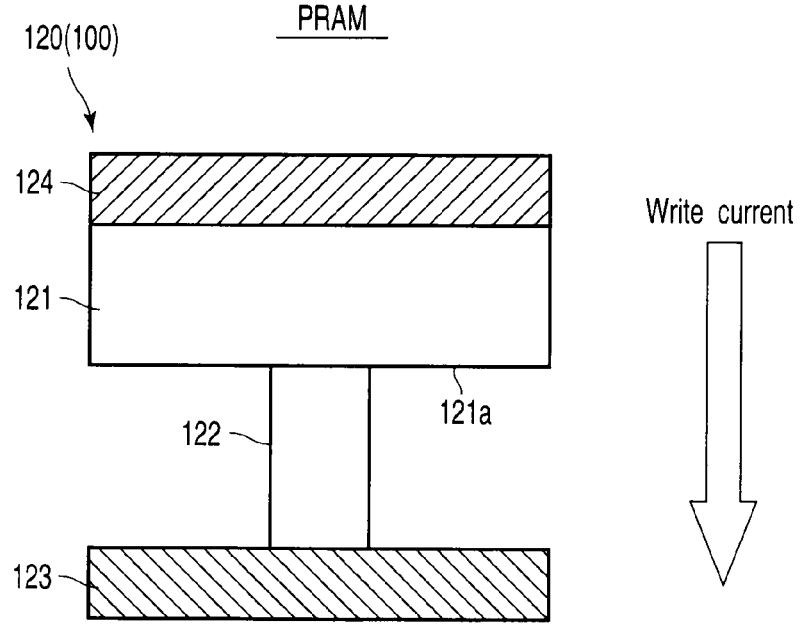
FIG. 6 is a sectional view of a chalcogenide element of a PRAM according to the embodiment of the present invention.

FIG. 6 is a sectional view of a chalcogenide element of a PRAM according to the embodiment of the present invention. The chalcogenide element of the PRAM will be explained below.

As shown in FIG. 6, the PRAM has a chalcogenide element 120 in a memory cell. The chalcogenide element 120 is a resistance change element 100. The chalcogenide element 120 has a phase change material layer 121, heater layer 122, lower electrode 123, and upper electrode 124.

The phase change material layer 121 changes into a crystalline state or amorphous state owing to heat generated by data write, thereby functioning as a storage portion. The phase change material layer 121 is made of a chalcogenide such as Ge—Sb—Te (GST), In—Sb—Te, Ag—In—Sb—Te, or Ge—Sn—Te.

The heater layer 122 is in direct contact with a first surface 121a of the phase change material layer 121. That area of the heater layer 122 which is in contact with the phase change material layer 121 is desirably smaller than the area of the first surface 121a of the phase change material layer 121. This is so because the write current or voltage can be reduced by decreasing the size of a portion to be heated by decreasing the size of the contact portion between the phase change material layer 121 and heater layer 122. The heater layer 122 is made of a conductive material. For example, the heater layer 122 is preferably made of at least one material selected from TiN, TiAlN, TiBN, TiSiN, TaN, TaAlN, TaBN, TaSiN, WN, WAlN, WBN, WSiN, ZrN, ZrAlN, ZrBN, ZrSiN, MoN, Al, Al—Cu, Al—Cu—Si, WSix, Ti, TiW, and Cu. The heater layer 122 may also be made of the same material as that of the lower electrode 123 or upper electrode 124 described below.

The lower electrode 123 is formed on the surface of the heater layer 122 away from the surface opposing the phase change material layer 121. The planar shape of the lower electrode 123 is larger than that of, e.g., the heater layer 122. Examples of the material of the lower electrode 123 are refractory metals such as Ta, Mo, and W.

The upper electrode 124 is formed on the surface of the phase change material layer 121 away from the surface opposing the heater layer 122. The upper electrode 124 has the same planar shape as that of, e.g., the phase change material layer 121. Examples of the material of the upper electrode 124 are refractory metals such as Ta, Mo, and W.

Figure 7:
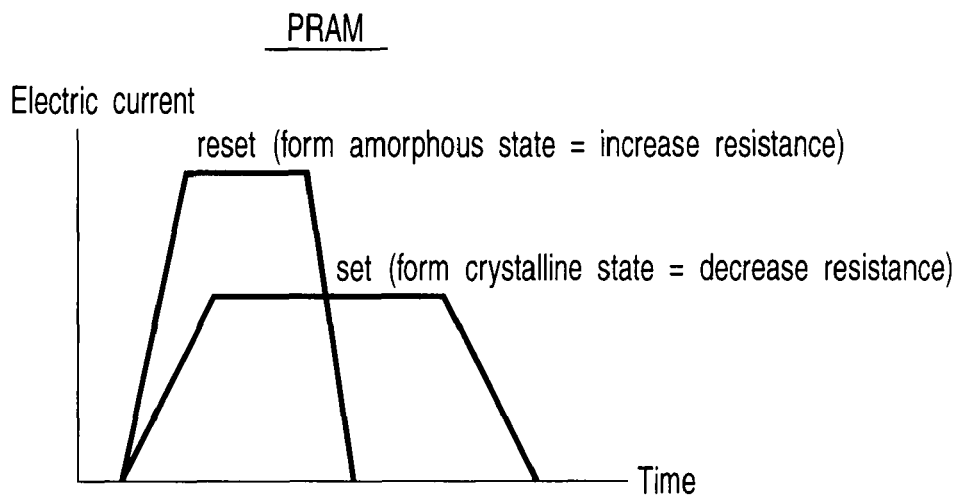
FIG. 7 is a graph showing the low-resistance state and high-resistance state of the chalcogenide element shown in FIG. 6.

FIG. 7 shows the low-resistance state and high-resistance state of the chalcogenide element shown in FIG. 6. The low-resistance state and high-resistance state of the chalcogenide element will be explained below.

As shown in FIG. 7, the heating temperature of the chalcogenide element 120 is changed by controlling the magnitude and width (application time) of a current pulse to be applied to the chalcogenide element 120. Consequently, the chalcogenide element 120 changes into a crystalline state or amorphous state.

More specifically, in a write operation, a voltage or electric current is applied between the lower electrode 123 and upper electrode 124, thereby supplying an electric current from the upper electrode 124 to the lower electrode 123 via the phase change material layer 121 and heater layer 122. When the material of the phase change material layer 121 is thus heated to about the melting point, the phase change material layer 121 changes to an amorphous phase (high-resistance phase), and this state is maintained even when the application of the voltage or electric current is stopped.

On the other hand, when the material of the phase change material layer 121 is heated to about a temperature suitable for crystallization of the material of the phase change material layer 121 by applying a voltage or electric current between the lower electrode 123 and upper electrode 124 in a write operation, the material of the phase change material layer 121 changes to a crystalline phase (low-resistance phase). This state is maintained even when the heating is stopped.

When changing the chalcogenide element 120 to the crystalline state, it is preferable to decrease the magnitude of the pulse to be applied to the chalcogenide element 120 and increase the width (application time) of the pulse, compared to the case where the chalcogenide element 120 is to be changed to the amorphous state.

As described above, the electrical resistance between the lower electrode 123 and upper electrode 124 can be changed by heating the phase change material layer 121 and heater layer 122 by applying a voltage or electric current between the lower electrode 123 and upper electrode 124. Note that the write current flows from the upper electrode 124 to the lower electrode 123 in this example, but it may also flow from the lower electrode 123 to the upper electrode 124.

Whether the chalcogenide element 120 has a crystalline phase or amorphous phase can be discriminated by applying, between the lower electrode 123 and upper electrode 124, a low voltage or low electric current that does not make the phase change material layer 121 crystalline or amorphous, and reading the voltage or electric current between the lower electrode 123 and upper electrode 124. Therefore, 1-bit information can be recorded and reproduced by using one memory cell by making the crystalline phase state and amorphous phase state correspond to 0 and 1 or 1 and 0.

Note that in a write operation, current control is performed to set the phase change material layer 121 in the crystalline state (low-resistance state), and voltage control is performed to set the phase change material layer 121 in the amorphous state (high-resistance state). Details will be described later.

[3-3] ReRAM

Figure 8:
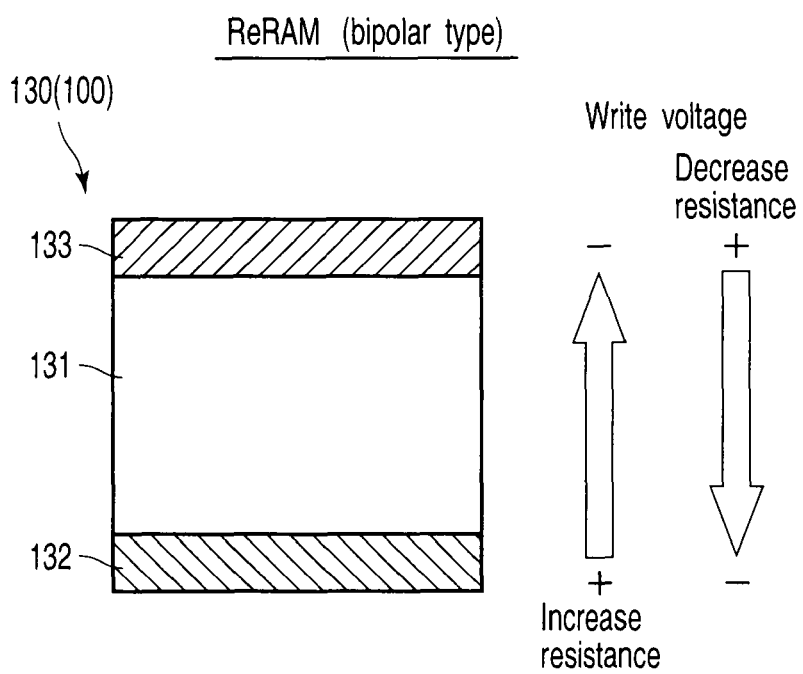
FIG. 8 is a sectional view of a transition metal oxide element of a bipolar ReRAM according to the embodiment of the present invention.

FIG. 8 is a sectional view of a transition metal oxide element of a bipolar ReRAM according to the embodiment of the present invention. FIG. 9 is a sectional view of a transition metal oxide element of a unipolar ReRAM according to the embodiment of the present invention. FIG. 10 shows the low-resistance state and high-resistance state of the transition metal oxide element of the unipolar ReRAM shown in FIG. 9. The transition metal oxide element of the ReRAM will be explained below.

As shown in FIGS. 8 and 9, the ReRAM has a transition metal oxide element 130 in a memory cell. The transition metal oxide element 130 is a resistance change element 100. The transition metal oxide element 130 has a transition metal oxide layer 131, lower electrode 132, and upper electrode 133.

The transition metal oxide layer 131 is formed between the lower electrode 132 and upper electrode 133, and functions as a storage portion. The transition metal oxide layer 131 can be made of a single layer or a plurality of layers.

As disclosed in non-patent reference 2 described earlier, a resistance change occurs in different portions of the transition metal oxide layer 131 in accordance with the type of metal oxide. That is, the portions can be classified into (a) the junction interface between the metal oxide and electrode, and (b) a narrow conductive path (filament) in the metal oxide. The resistance change of the transition metal oxide layer 131 occurs in either portion because oxygen ions ($O^{2-}$) diffuse or the trap level captures electrons. Details of the mechanism of this resistance change are described in non-patent reference 2.

(a) An element in which the resistance change occurs in the junction interface between the metal oxide and electrode is principally an element using a perovskite metal oxide such as $Pr_{0.7}Ca_{0.3}MnO_3$ (PCMO) or Nb-doped $SrTiO_3$ (Nb:STO). An element using this material is "a bipolar element" in which the resistance value largely changes when the polarity of the application voltage is inverted.

In this bipolar element, a write operation is controlled as follows. As shown in FIG. 8, when changing the transition metal oxide element 130 from the high-resistance state to the low-resistance state (e.g., 0 write), the polarity of the application voltage is set negative on the side of the lower electrode 132, and positive on the side of the upper electrode 133. On the other hand, when changing the transition metal oxide element 130 from the low-resistance state to the high-resistance state (e.g., 1 write), the polarity of the application voltage is set positive on the side of the lower electrode 132, and negative on the side of the upper electrode 133. The low-resistance state and high-resistance state of the transition metal oxide element 130 can be created by thus inverting the polarity of the application voltage.

(b) An element in which the resistance change occurs in the filament is principally an element using a binary metal oxide such as NiO or $TiO_2$. A memory element using the binary metal oxide is "a unipolar element" in which the resistance value changes in accordance with the difference between the absolute values of the application voltage, regardless of the polarity of the voltage.

In this unipolar element, a write operation is controlled as follows. As shown in FIG. 9, when changing the transition metal oxide element 130 from the high-resistance state to the low-resistance state (e.g., 0 write) and from the low-resistance state to the high-resistance state (e.g., 1 write), a voltage or electric current is applied between the lower electrode 132 and upper electrode 133, thereby supplying an electric current from the upper electrode 133 to the lower electrode 132 via the transition metal oxide layer 131. As shown in FIG. 10, when increasing the resistance, it is preferable to decrease the magnitude of the pulse to be applied to the transition metal oxide element 130 and increase the width (application time) of the pulse, compared to the case where the resistance is to be decreased. Note that the write current flows from the upper electrode 133 to the lower electrode 132 in this embodiment, but it may also flow from the lower electrode 132 to the upper electrode 133.

Note also that in a write operation, current control is performed when decreasing the resistance of the transition metal oxide element 130, and voltage control is performed when increasing the resistance of the transition metal oxide element 130. Details will be described later.

[3-4] Classification

FIG. 11 is a view showing the classification of the resistance change memories according to the embodiment of the present invention. The resistance change memories are classified into two types as will be explained below.

As shown in FIG. 11, the resistance change memories can be classified into two types: (a) a memory in which a write current flows in two directions in a write operation, and (b) a memory in which a write current flows in one direction in a write operation. The MRAM and bipolar ReRAM correspond to the former. The PRAM and unipolar ReRAM correspond to the latter.

[4] Circuit Configurations of Resistance Change Memories

The circuit configurations of (a) the MRAM and bipolar ReRAM as bidirectional write type memories and (b) the PRAM and unipolar ReRAM as unidirectional write type memories will be explained below.

[4-1] Configuration Example 1

Configuration example 1 is applied to (a) the resistance change memories such as the MRAM and bipolar ReRAM in which the write current flows in two directions.

Figure 12:
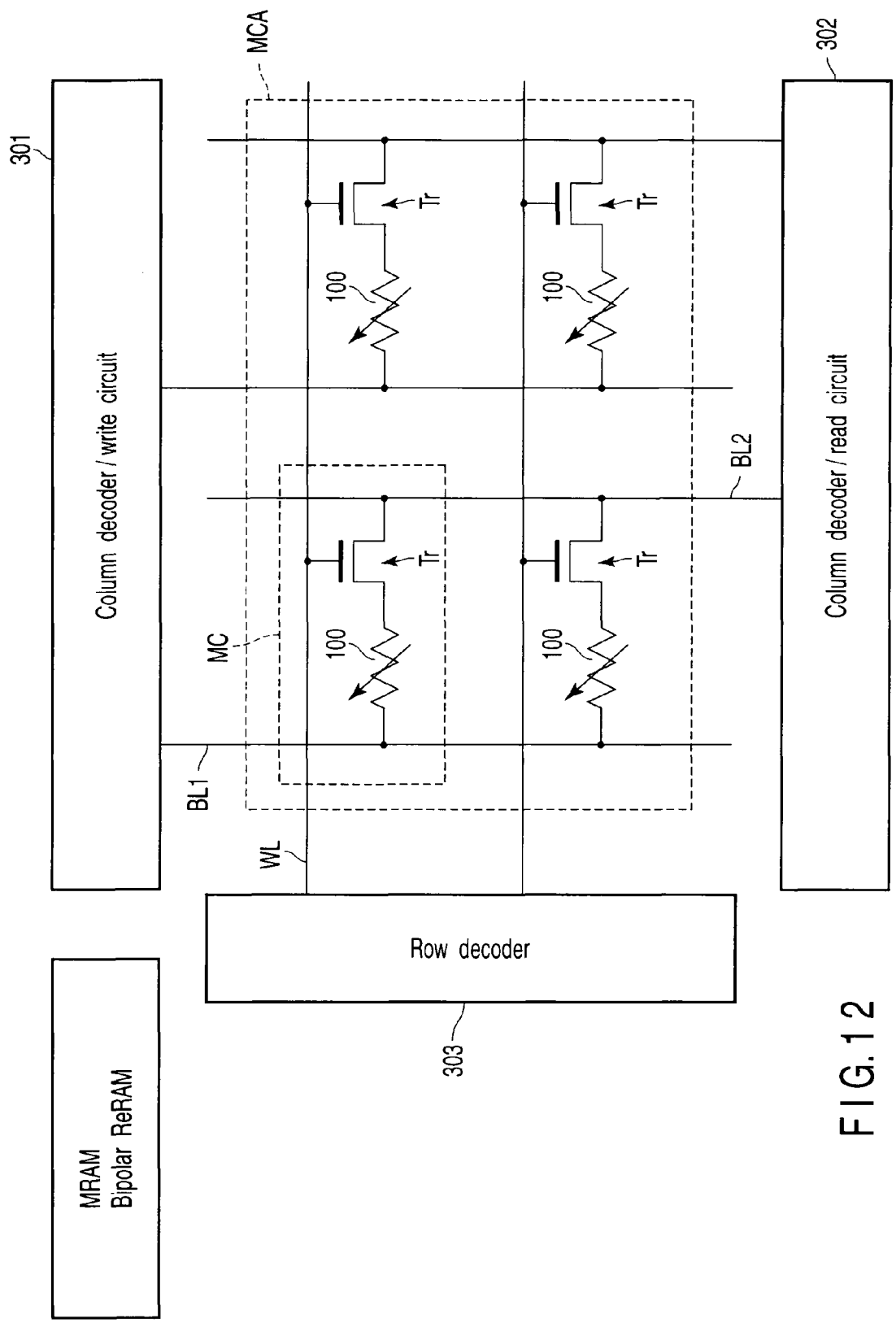
FIG. 12 is a schematic view of configuration example 1 of the resistance change memory according to the embodiment of the present invention.

FIG. 12 is a schematic view of configuration example 1 of the resistance change memory according to the embodiment of the present invention. Configuration example 1 of the resistance change memory will be explained below.

As shown in FIG. 12, a memory cell array MCA is formed by arranging memory cells MC in a matrix. Each memory cell MC has a series circuit of a resistance change element 100 and cell transistor Tr. A column decoder/write circuit 301, column decoder/read circuit 302, and row decoder 303 are arranged around the memory cell array MCA.

The resistance change element 100 has one terminal connected to one end of the current path (source/drain) of the cell transistor Tr, and the other terminal connected to a first bit line BL1. The first bit line BL1 is connected to the column decoder/write circuit 301. The other end of the current path of the cell transistor Tr is connected to a second bit line BL2. The second bit line BL2 is connected to the column decoder/read circuit 302. The gate of the cell transistor Tr is connected to a word line WL. The word line WL is connected to the row decoder 303.

In configuration example 1 as described above, the write current flows through the resistance change element 100 in two directions in a write operation. That is, the write current flows from the first bit line BL1 to the second bit line BL2 via the resistance change element 100, or flows from the second bit line BL2 to the first bit line BL1 via the resistance change element 100.

[4-2] Configuration Example 2

Configuration example 2 is applied to (b) the resistance change memories such as the PRAM and unipolar ReRAM in which the write current flows in one direction.

Figure 13:
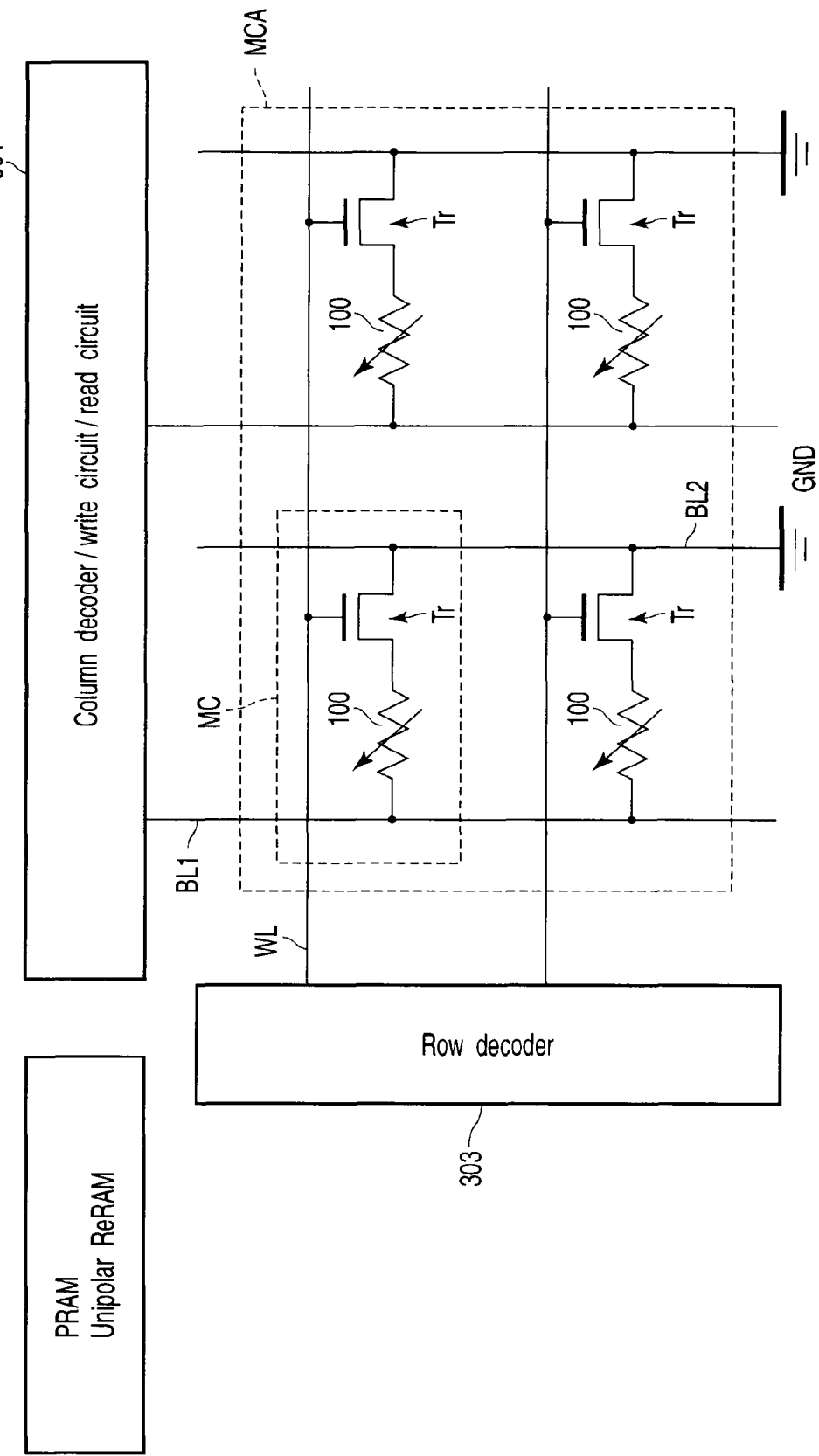
FIG. 13 is a schematic view of configuration example 2 of the resistance change memory according to the embodiment of the present invention.

FIG. 13 is a schematic view of configuration example 2 of the resistance change memory according to the embodiment of the present invention. Configuration example 2 of the resistance change memory will be explained below.

As shown in FIG. 13, configuration example 2 differs from configuration example 1 in that a first bit line BL1 is connected to a column decoder/write circuit/read circuit 304, and a second bit line BL2 is connected to a ground terminal GND.

In configuration example 2 as described above, the write current flows through a resistance change element 100 in one direction. That is, the write current flows from the first bit line BL1 to the second bit line BL2 via the resistance change element 100.

Note that this example may also be changed such that the write current flows from the second bit line BL2 to the first bit line BL1 via the resistance change element 100.

[4-3] Configuration Example 3

Configuration example 3 is applied to (b) the resistance change memories such as the PRAM and unipolar ReRAM in which the write current flows in one direction.

Figure 14:
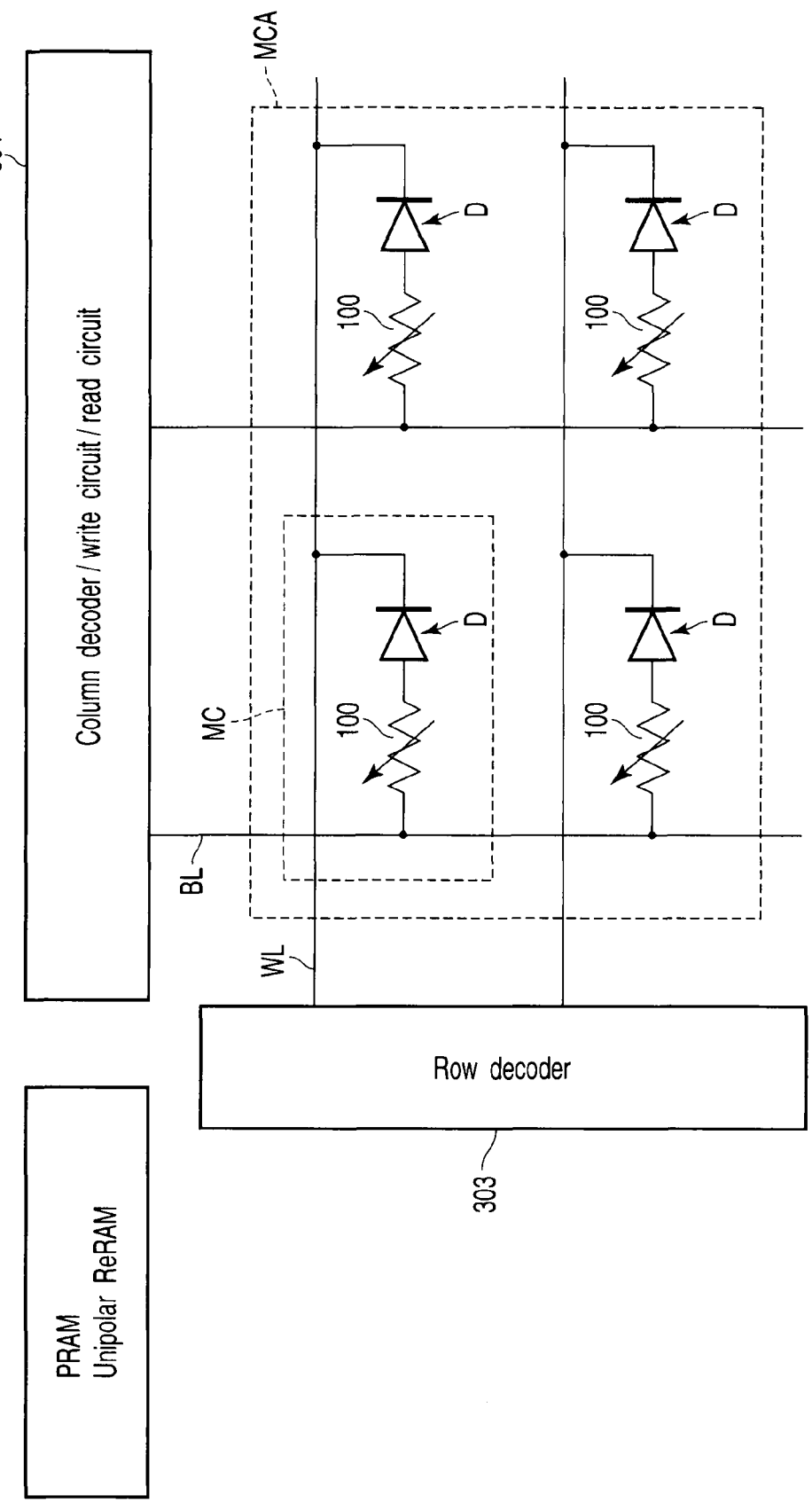
FIG. 14 is a schematic view of configuration example 3 of the resistance change memory according to the embodiment of the present invention.

FIG. 14 is a schematic view of configuration example 3 of the resistance change memory according to the embodiment of the present invention. Configuration example 3 of the resistance change memory will be explained below.

As shown in FIG. 14, configuration example 3 differs from configuration example 2 in that a diode D is formed instead of the cell transistor Tr. More specifically, the diode D has one terminal connected to one terminal of a resistance change element 100, and the other terminal connected to a word line WL.

In configuration example 3 as described above, the write current flows through the resistance change element 100 in one direction in a write operation as in configuration example 2. That is, the write current flows from a bit line BL to the word line WL via the resistance change element 100.

Note that this example may also be changed such that the write current flows from the word line WL to the bit line BL via the resistance change element 100.

[5] Write Circuits

Write circuits of (a) the MRAM and bipolar ReRAM as bidirectional write type memories and (b) the PRAM and unipolar ReRAM as unidirectional write type memories will be explained below.

[5-1] Circuit Example 1

Circuit example 1 is applied to (a) the resistance change memories such as the MRAM and bipolar ReRAM in which the write current flows in two directions.

Figure 15:
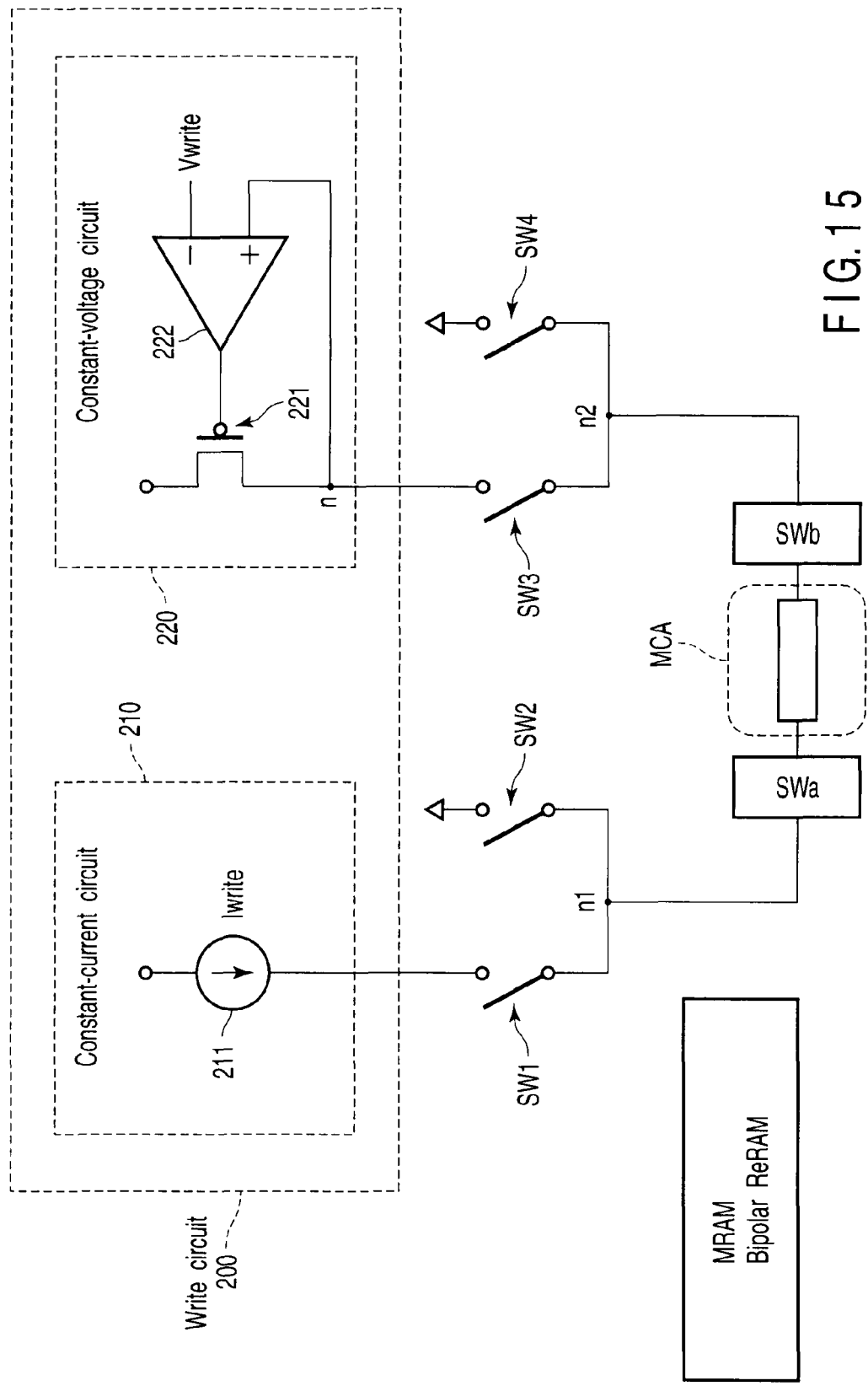
FIG. 15 is a schematic view of circuit example 1 of a write circuit according to the embodiment of the present invention.

FIG. 15 is a schematic view of circuit example 1 of the write circuit according to the embodiment of the present invention. Circuit example 1 of the write circuit will be explained below.

As shown in FIG. 15, a write circuit 200 of circuit example 1 has a constant-current circuit 210 and constant-voltage circuit 220.

The constant-current circuit 210 is a circuit that generates a constant electric current. The constant-current circuit 210 has a current source 211.

The constant-voltage circuit 220 is a circuit that generates a constant voltage. The constant-voltage circuit 220 has a transistor 221 and operational amplifier 222. One end of the current path of the transistor 221 is connected to a node n, and the gate of the transistor 221 is connected to the output terminal of the operational amplifier 222. The positive (+) input terminal of the operational amplifier 222 is connected to the node n, and a write signal Vwrite is input to the negative (−) input terminal of the operational amplifier 222.

The write circuit 200 as described above is electrically connected to or disconnected from the memory cell array MCA by turning on or off switches SW1, SW2, SW3, SW4, SWa, and SWb.

The switch SW1 has one terminal connected to the current source 211, and the other terminal connected to a node n1. The switch SW2 has one terminal connected to a ground terminal, and the other terminal connected to the node n1. The switch SW3 has one terminal connected to the node n of the constant-voltage circuit 220, and the other terminal connected to a node n2. The switch SW4 has one terminal connected to the ground terminal, and the other terminal connected to the node n2. The switch SWa has one terminal connected to the node n1, and the other terminal connected to one terminal of the memory cell array MCA (one terminal of the resistance change element 100). The switch SWb has one terminal connected to the node n2, and the other terminal connected to the other terminal of the memory cell array MCA (the other terminal of the resistance change element 100).

When changing the resistance change element 100 from the high-resistance state to the low-resistance state, the switches SW1, SW4, SWa, and SWb are turned on and the switches SW2 and SW3 are turned off in the write circuit 200 of this example. Consequently, the constant-current circuit 210 is electrically connected to one terminal of the memory cell array MCA, and the write current flows from the switch SW1 to the switch SW4 via the resistance change element.

On the other hand, when changing the resistance change element 100 from the low-resistance state to the high-resistance state, the switches SW2, SW3, SWa, and SWb are turned on, and the switches SW1 an SW4 are turned off. Consequently, the constant-voltage circuit 220 is electrically connected to the other terminal of the memory cell array MCA, and the write current flows from the switch SW3 to the switch SW2 via the resistance change element.

In a write operation as described above, a constant electric current is supplied when decreasing the resistance, and a constant voltage is applied when increasing the resistance.

[5-2] Circuit Example 2

Circuit example 2 is applied to (b) the resistance change memories such as the PRAM and unipolar ReRAM in which the write current flows in one direction.

Figure 16:
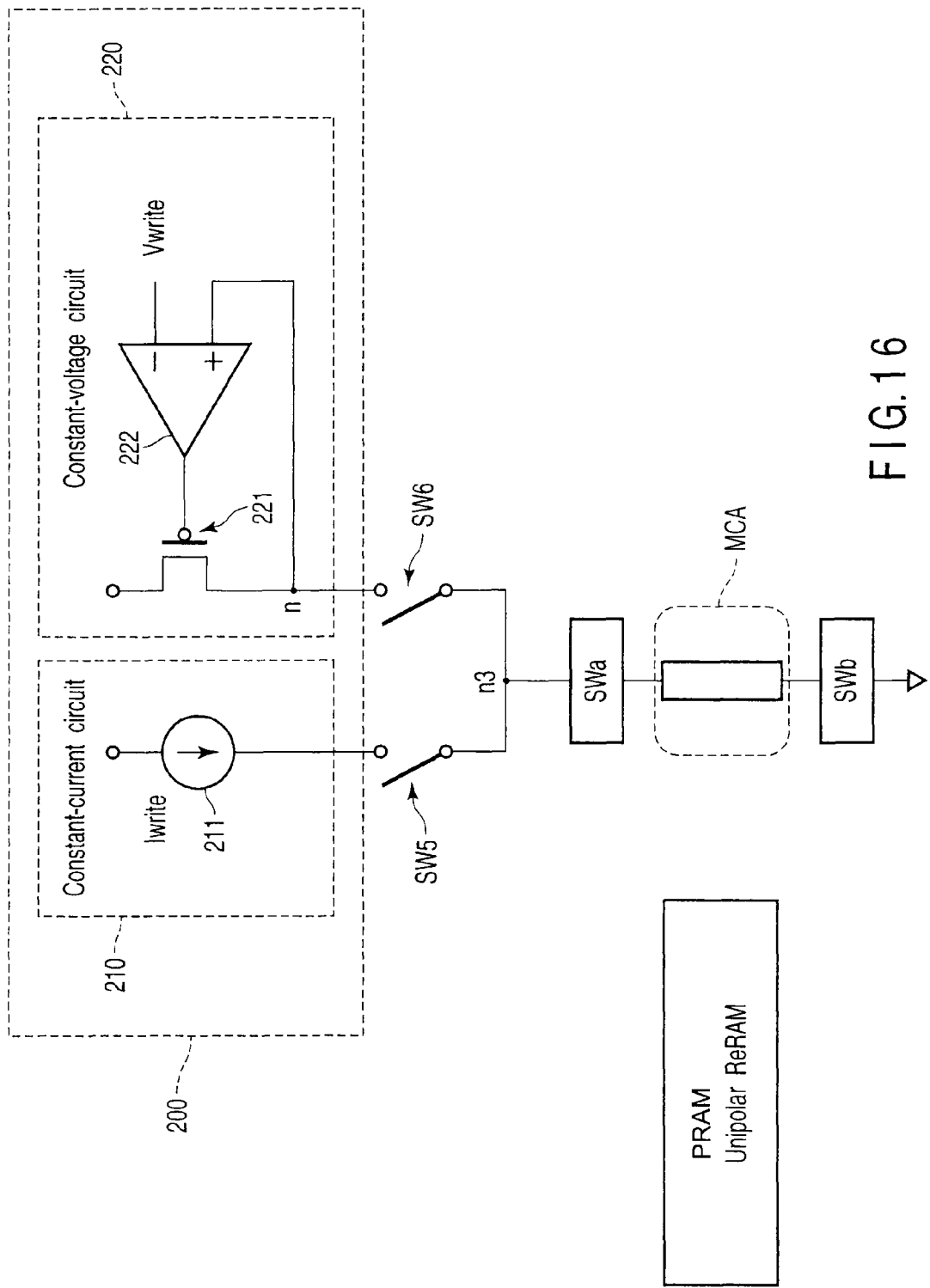
FIG. 16 is a schematic view of circuit example 2 of the write circuit according to the embodiment of the present invention.

FIG. 16 is a schematic view of circuit example 2 of the write circuit according to the embodiment of the present invention. Circuit example 2 of the write circuit will be explained below.

As shown in FIG. 16, circuit example 2 differs from circuit example 1 in the connection between a write circuit 200 and the memory cell array MCA. More specifically, a constant-current circuit 210 and constant-voltage circuit 220 are connected to the same terminal of the memory cell array MCA (the same terminal of the resistance change element 100). That is, the constant-current circuit 210 is connected to a node n3 via a switch SW5, and the constant-voltage circuit 220 is connected to the node n3 via a switch SW6.

When changing the resistance change element 100 from the high-resistance state to the low-resistance state, the switch SW5 and switches SWa and SWb are turned on and the switch SW6 is turned off in the write circuit 200 of this example. Consequently, the constant-current circuit 210 is electrically connected to the memory cell array MCA, and the write current flows from the switch SW5 to a ground terminal via the resistance change element.

On the other hand, when changing the resistance change element 100 from the low-resistance state to the high-resistance state, the switches SW6, SWa, and SWb are turned on, and the switch SW5 is turned off. Consequently, the constant-voltage circuit 220 is electrically connected to the memory cell array MCA, and the write current flows from the switch SW5 to the ground terminal via the resistance change element.

In a write operation as described above, a constant electric current is supplied when decreasing the resistance, and a constant voltage is applied when increasing the resistance.

[6] Other Embodiments

[6-1] Example 1

Figures 17A, 17B:
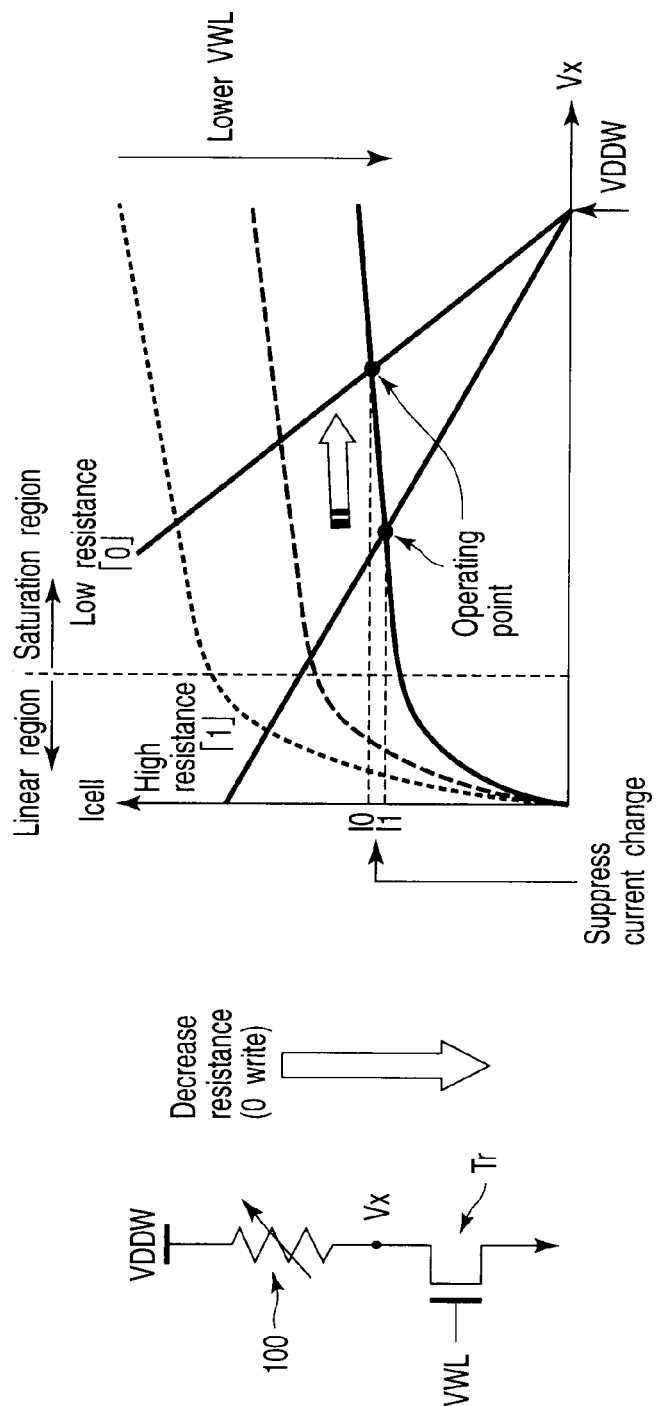
FIGS. 17A and 17B are views for explaining current control when decreasing the resistance of the resistance change element according to the embodiment of the present invention.
Figure 18A:
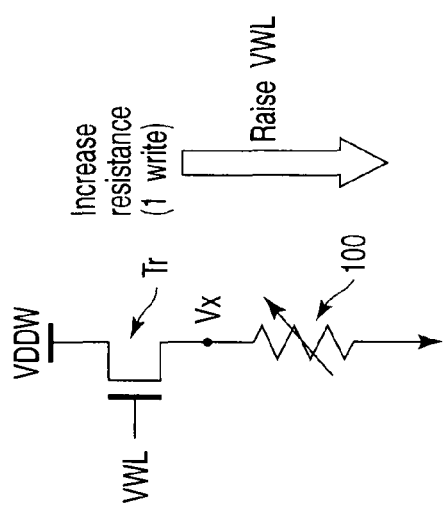
FIGS. 18A and 18B are views for explaining current control when increasing the resistance of the resistance change element according to the embodiment of the present invention.
Figure 18B:
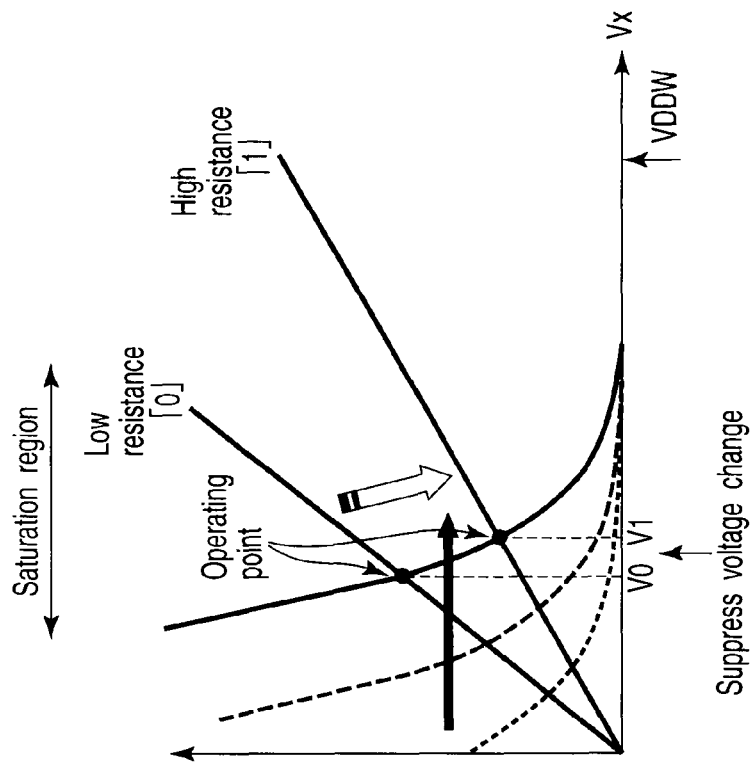

FIGS. 17A and 17B are views for explaining current control for decreasing the resistance of the resistance change element according to the embodiment of the present invention. FIGS. 18A and 18B are views for explaining voltage control for increasing the resistance of the resistance change element according to the embodiment of the present invention.

As shown in FIG. 17A, when decreasing the resistance of the resistance change element 100 (0 write), the write current is supplied from the resistance change element 100 to the cell transistor Tr. In this case, the electric current flowing through the resistance change element 100 is held constant before and after the change of the resistance change element 100 from the high-resistance state to the low-resistance state. In other words, when decreasing the resistance, the cell transistor Tr is operated in a saturation region. That is, as shown in FIG. 17B, in the saturation region of the cell transistor Tr, there is almost no difference between the value of an electric current I1 at the operating point in the high-resistance state and that of an electric current I0 at the operating point in the low-resistance state, so the current change can be suppressed. The effect of this operation can be further increased by lowering an application voltage VWL to the gate of the cell transistor Tr.

As shown in FIG. 18A, when increasing the resistance of the resistance change element 100 (1 write), the write current is supplied from the cell transistor Tr to the resistance change element 100. In this case, the voltage applied to the resistance change element 100 is held constant before and after the change of the resistance change element 100 from the low-resistance state to the high-resistance state. In other words, when decreasing the resistance, the cell transistor Tr is operated in a saturation region. That is, as shown in FIG. 18B, in the saturation region of the cell transistor Tr, there is almost no difference between the value of a voltage V1 at the operating point in the low-resistance state and that of a voltage V0 at the operating point in the high-resistance state, so the voltage change can be suppressed. The effect of this operation can be further increased by raising the application voltage VWL to the gate of the cell transistor Tr.

[6-2] Example 2

Figure 19:
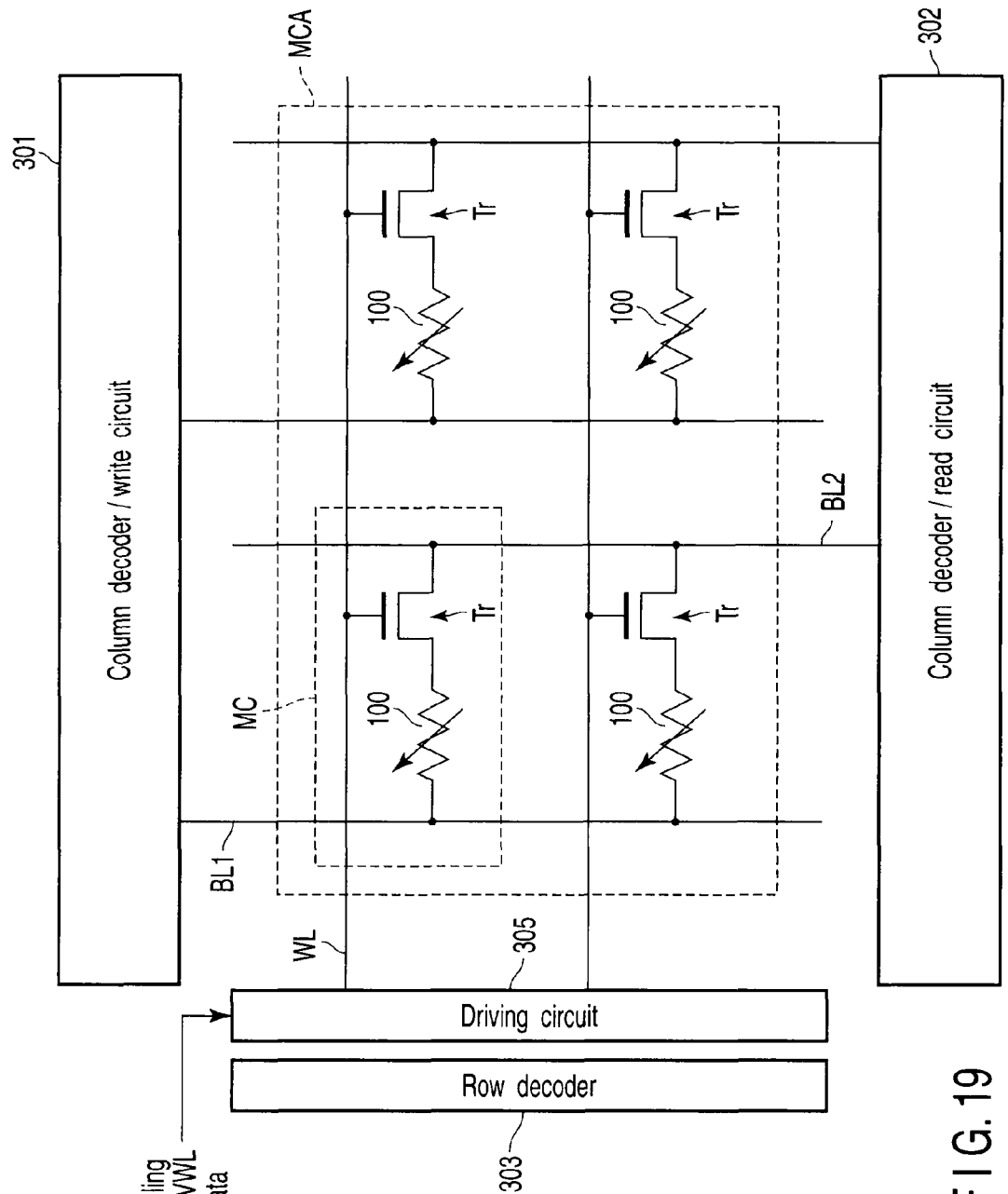
FIG. 19 is a schematic view showing an example of the arrangement of the resistance change memory according to the embodiment of the present invention.

FIG. 19 is a schematic view of an example of the arrangement of the resistance change memory according to the embodiment of the present invention.

As shown in FIG. 19, a driving circuit 305 is connected to word lines WL. The driving circuit 305 controls the voltage VWL of a selected word line WL (the gate of the cell transistor Tr) in accordance with write data. For example, when changing the resistance change element 100 from the high-resistance state to the low-resistance state, the gate voltage VWL of the cell transistor Tr is set at a first voltage. When changing the resistance change element 100 from the low-resistance state to the high-resistance state, the gate voltage VWL of the cell transistor Tr is set at a second voltage higher than the first voltage.

[7] Effects

In a resistance change memory, heat generation facilitates a write operation before the resistance of the resistance change element 100 changes. After the resistance of the resistance change element 100 has changed, however, the heat amount is desirably reduced in order to prevent a write error or resistance value change error caused by the heat.

In the embodiment of the present invention, therefore, when changing the resistance change element 100 from the high-resistance state to the low-resistance state, the write current is supplied such that the electric current of the memory cell is held constant before and after the change. When changing the resistance change element 100 from the low-resistance state to the high-resistance state, the write voltage is applied such that the voltage of the memory cell is held constant before and after the change. This makes it possible to eliminate the increase in heat amount caused by the application of the electric current or voltage after the resistance change, thereby preventing a write error to the resistance change element 100 or the increase in resistance variation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resistance change memory comprising:
a resistance change element having a high-resistance state and a low-resistance state in accordance with write information;
a write circuit configured to supply a write current that the write current flowing through the resistance change element is held constant before and after the resistance change element is changed from the high-resistance state to the low-resistance state, and apply a write voltage that the write voltage applied to the resistance change element is held constant before and after the resistance change element is changed from the low-resistance state to the high-resistance state, said write circuit comprising a constant-current circuit configured to supply the write current, and a constant-voltage circuit configured to apply the write voltage;
wherein the resistance change memory further comprises:
a first switch having one terminal connected to the constant-current circuit, and the other terminal connected to a first node;
a second switch having one terminal connected to a ground terminal, and the other terminal connected to the first node;
a third switch having one terminal connected to the constant-voltage circuit, and the other terminal connected to a second node; and
a fourth switch having one terminal connected to the ground terminal, and the other terminal connected to the second node, and
in which the first node is connected to one terminal of the resistance change element, and the second node is connected to the other terminal of the resistance change element,
when changing the resistance change element to the low-resistance state, the write current is supplied from the first switch to the fourth switch via the resistance change element by turning on the first switch and the fourth switch and turning off the second switch and the third switch, and
when changing the resistance change element to the high-resistance state, the write voltage is applied from the third switch to the second switch via the resistance change element by turning on the second switch and the third switch and turning off the first switch and the fourth switch.

2. The memory according to claim 1, which further comprises:
a cell transistor having a current path whose one end is connected to one terminal of the resistance change element;
a first wiring connected to the other terminal of the resistance change element; and
a second wiring connected to the other end of the current path of the cell transistor, and
in which a direction of the write current supplied when changing the resistance change element to the low-resistance state and a direction of the write voltage applied when changing the resistance change element to the high-resistance state are opposite to each other.

3. The memory according to claim 1, wherein the resistance change element is one of a magnetoresistive element, a chalcogenide element, and a transition metal oxide element.

4. The memory according to claim 1, further comprising:
a cell transistor connected in series with the resistance change element; and
a driving circuit configured to set a gate voltage of the cell transistor at a first voltage when changing the resistance change element to the low-resistance state, and set the gate voltage of the cell transistor at a second voltage higher than the first voltage when changing the resistance change element to the high-resistance state.

5. A resistance change memory comprising:
a resistance change element having a high-resistance state and a low-resistance state in accordance with write information;
a write circuit configured to supply a write current that the write current flowing through the resistance change element is held constant before and after the resistance change element is changed from the high-resistance state to the low-resistance state, and apply a write voltage that the write voltage applied to the resistance change element is held constant before and after the resistance change element is changed from the low-resistance state to the high-resistance state;
wherein the write circuit has a constant-current circuit configured to supply the write current, and a constant-voltage circuit configured to apply the write voltage;
wherein the memory further comprises:
a first switch having one terminal connected to the constant-current circuit, and the other terminal connected to a node; and
a second switch having one terminal connected to the constant-voltage circuit, and the other terminal connected to the node, and
in which the node is connected to one terminal of the resistance change element,
when changing the resistance change element to the low-resistance state, the write current is supplied from the first switch to the resistance change element by turning on the first switch and turning off the second switch, and
when changing the resistance change element to the high-resistance state, the write voltage is applied from the second switch to the resistance change element by turning on the second switch and turning off the first switch.

6. The memory according to claim 5, which further comprises:
a cell transistor having a current path whose one end is connected to one terminal of the resistance change element;
a first wiring connected to the other terminal of the resistance change element; and
a second wiring connected to the other end of the current path of the cell transistor, and having one end connected to a ground terminal, and
in which a direction of the write current supplied when changing the resistance change element to the low-resistance state and a direction of the write voltage applied when changing the resistance change element to the high-resistance state are the same.

7. The memory according to claim 5, which further comprises:
a diode having a current path whose one end is connected to one terminal of the resistance change element;
a first wiring connected to the other terminal of the resistance change element; and
a second wiring connected to the other end of the current path of the diode, and
in which a direction of the write current supplied when changing the resistance change element to the low-resistance state and a direction of the write voltage applied when changing the resistance change element to the high-resistance state are the same.

8. The memory according to claim 5, which further comprises a cell transistor connected in series with the resistance change element, and
    in which the cell transistor is operated in a saturation region when changing the resistance change element to the high-resistance state and the low-resistance state.

9. A write method of a resistance change memory including a resistance change element having a high-resistance state and a low-resistance state in accordance with write information, wherein the resistance change memory comprises a first switch having one terminal connected to a constant-current circuit, and the other terminal connected to a first node,
    a second switch having one terminal connected to a ground terminal, and the other terminal connected to the first node,
    a third switch having one terminal connected to a constant-voltage circuit, and the other terminal connected to a second node, and
    a fourth switch having one terminal connected to the ground terminal, and the other terminal connected to the second node,
    in which the first node is connected to one terminal of the resistance change element, and the second node is connected to the other terminal of the resistance change element,
    the method comprising:
    supplying a write current that the write current flowing through the resistance change element is held constant before and after the resistance change element is changed from the high-resistance state to the low-resistance state, and applying a write voltage that the write voltage applied to the resistance change element is held constant before and after the resistance change element is changed from the low-resistance state to the high-resistance state, and
    when changing the resistance change element to the low-resistance state, supplying the write current from the first switch to the fourth switch via the resistance change element by turning on the first switch and the fourth switch and turning off the second switch and the third switch, and
    when changing the resistance change element to the high-resistance state, applying the write voltage from the third switch to the second switch via the resistance change element by turning on the second switch and the third switch and turning off the first switch and the fourth switch.

10. The method according to claim 9, wherein a direction of the write current supplied when changing the resistance change element to the low-resistance state and a direction of the write voltage applied when changing the resistance change element to the high-resistance state are opposite to each other.

11. The method according to claim 9, in which the resistance change memory further includes a cell transistor connected in series with the resistance change element, and
    which further comprises setting a gate voltage of the cell transistor at a first voltage when changing the resistance change element to the low-resistance state, and setting the gate voltage of the cell transistor at a second voltage higher than the first voltage when changing the resistance change element to the high-resistance state.

12. The method according to claim 11, wherein the resistance change element is one of a magnetoresistive element, a chalcogenide element, and a transition metal oxide element.

13. A write method of a resistance change memory including
    a resistance change element having a high-resistance state and a low-resistance state in accordance with write information,
    a write circuit configured to supply a write current that the write current flowing through the resistance change element is held constant before and after the resistance change element is changed from the high-resistance state to the low-resistance state, and apply a write voltage that the write voltage applied to the resistance change element is held constant before and after the resistance change element is changed from the low-resistance state to the high-resistance state,
    wherein the write circuit has a constant-current circuit configured to supply the write current, and a constant-voltage circuit configured to apply the write voltage,
    wherein the memory further comprises.
    a first switch having one terminal connected to the constant-current circuit, and the other terminal connected to a node; and
    a second switch having one terminal connected to the constant-voltage circuit, and the other terminal connected to the node, and
    in which the node is connected to one terminal of the resistance change element, said method comprising:
    when changing the resistance change element to the low-resistance state, supplying the write current from the first switch to the resistance change element by turning on the first switch and turning off the second switch, and
    when changing the resistance change element to the high-resistance state, applying the write voltage from the second switch to the resistance change element by turning on the second switch and turning off the first switch,
    wherein a direction of the write current supplied when changing the resistance change element to the low-resistance state and a direction of the write voltage applied when changing the resistance change element to the high-resistance state are the same.

* * * * *